United States Patent [19]

Schwab

[11] Patent Number: 4,470,652
[45] Date of Patent: Sep. 11, 1984

[54] MODULAR ELECTRICAL SHUNTS FOR INTEGRATED CIRCUIT APPLICATIONS

[75] Inventor: Pierre P. Schwab, Port St. Lucy, Fla.

[73] Assignee: B/K Patent Development, Inc., Los Angeles, Calif.

[21] Appl. No.: 384,937

[22] Filed: Jun. 4, 1982

[51] Int. Cl.³ .............................................. H01R 31/08
[52] U.S. Cl. .................................................... 339/19
[58] Field of Search ............ 339/18 C, 19, 222, 252 R, 339/258 T; 29/881, 884

[56] References Cited

U.S. PATENT DOCUMENTS

| | | | |
|---|---|---|---|
| 2,858,372 | 10/1958 | Kaufman | 339/19 |
| 3,932,013 | 1/1976 | Yeager et al. | 339/217 S X |
| 4,029,377 | 6/1977 | Guglielmi | 339/19 |
| 4,030,793 | 6/1977 | Hanlon et al. | 339/18 C X |
| 4,056,299 | 11/1977 | Paige | 339/218 R X |
| 4,283,100 | 8/1981 | Griffin et al. | 339/19 |
| 4,356,361 | 10/1982 | Schwab | 200/16 D |
| 4,383,724 | 5/1983 | Verhoeven | 339/19 |

FOREIGN PATENT DOCUMENTS 1514988 6/1978 United Kingdom ................. 339/19

Primary Examiner—Eugene F. Desmond
Assistant Examiner—Steven C. Bishop
Attorney, Agent, or Firm—Pennie & Edmonds

[57] ABSTRACT

Modular electrical shunts for use in programming electric/electronic equipment are disclosed, comprising an electrically insulating, substantially rectangular housing having a plurality of electrically non-conducting walls, including a base wall having a pair of apertures in substantially mutually spaced relationship adapted to slidably receive male terminal pins, two end walls and two side walls. The housing further has an electrically insulating, substantially rectangular top cover bonded to the housing and having a pair of apertures corresponding in location to the apertures in the base wall of the housing, said cover being likewise adapted to slidably receive terminal pins passing through the base wall apertures. A pair of elongated, electrically conducting contacts are disposed within the housing and adapted for bias induced by the insertion of male terminal pins into the housing. In an alternate embodiment, a multitude of paired terminals are ganged in a single base.

11 Claims, 9 Drawing Figures

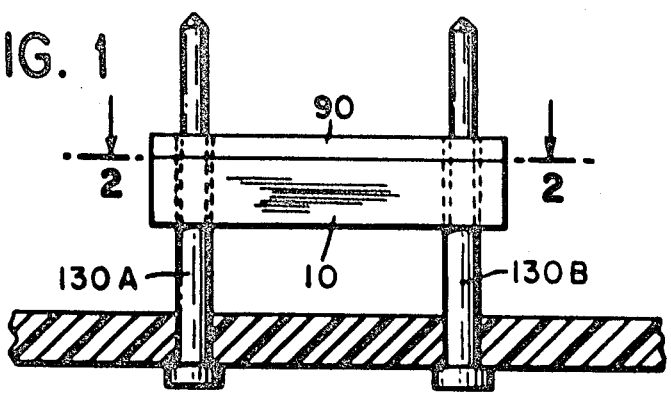
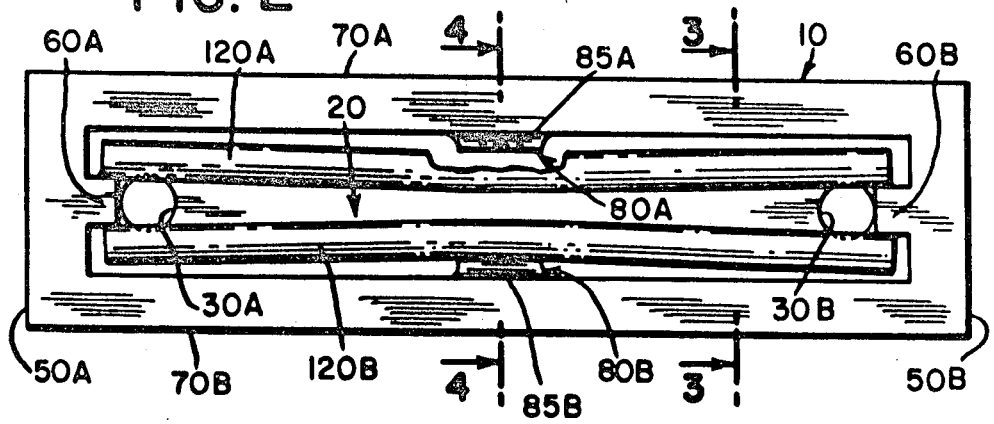
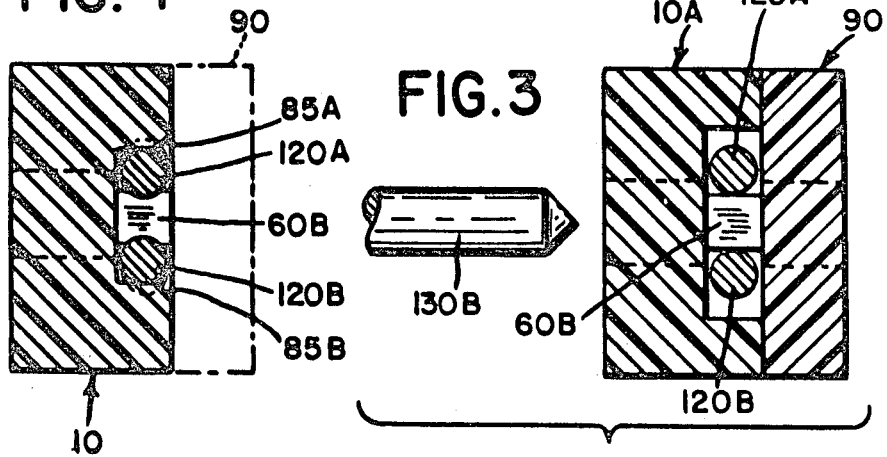

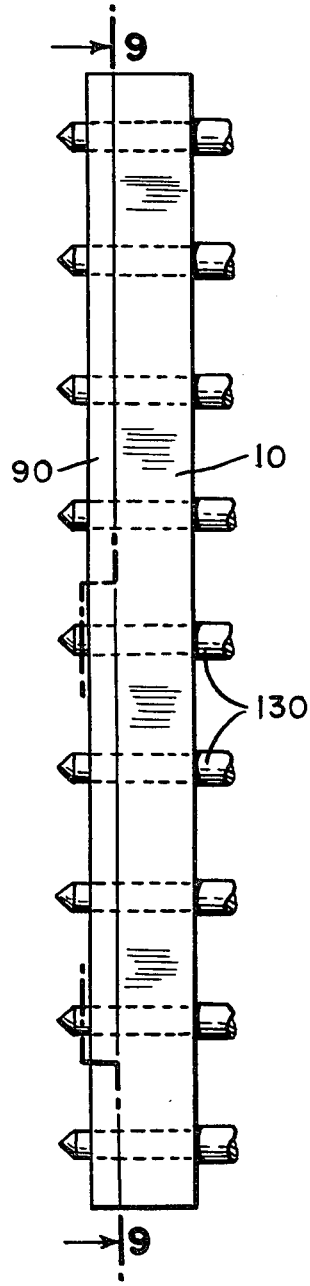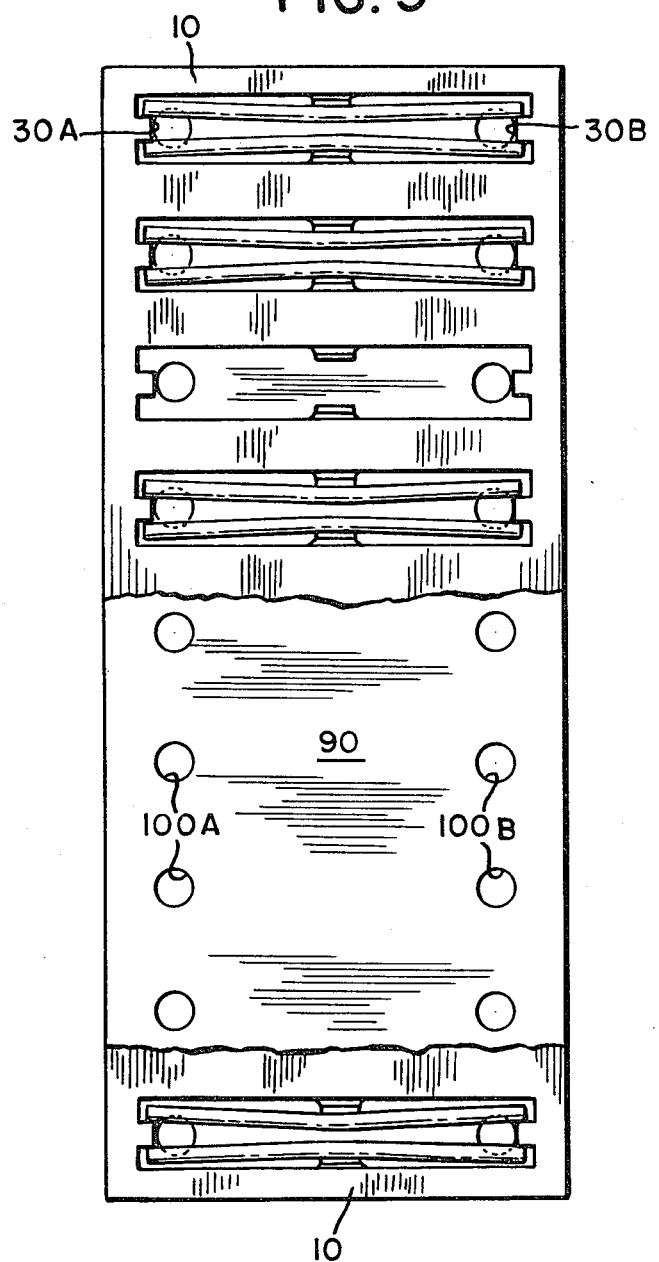

MODULAR ELECTRICAL SHUNTS FOR INTEGRATED CIRCUIT APPLICATIONS

BACKGROUND OF THE INVENTION

1. Field of the Invention

This invention relates to electrical shunts for electrical circuits.

More particularly, the invention has to do with novel electrical shunts of a modular design concept. The shunts of this invention are adapted for "closing" and/or "opening" electrical circuits, e.g., on printed circuit boards or cards, in a programmable manner.

2. Description of the Prior Art

The electronics industry presently utilizes certain devices called DIP-shunts (DIP being an acronym for "dual in-line packaged") adapted to fit specific industrial standard socket-terminal arrangements for components used in integrated circuit applications.

The sockets are arranged in industry-wide standard grid patterns which are dimensional multiples of 0.050" in each of the two dimensions, originally developed for integrated circuit applications. Typical socket grids are 0.100"×0.200" or 0.100"×0.300".

A DIP-shunt, also called a programming "jumper plug", is a type of device used in modern circuit design. These are described in U.S. Pat. No. 4,030,793 and are particularly useful for occasional re-programming of operating modes in electronic or electromechanical equipment such as vending machines, xerographic copiers, computer-controlled machinery, and the like. However, conventional DIP-shunts suffer the disadvantage of having metal jumper or shunt which is exposed to the environment, thereby increasing the risk of shortcircuiting during field service, unless the exposed electrically conducting part of the jumper is covered with a suitable insulating material.

A need has therefore existed for DIP-shunts of simpler mechanical design and greater durability in the field than those heretofore available.

Accordingly, it is an object of this invention to provide a structurally and mechanically reliable, readily packageable, and low cost DIP-shunt of a novel modular design concept for use in electrical circuits such as on printed circuit boards and in integrated circuits, in a programmable manner.

Another object is to provide shunts compatible with standard integrated circuit technology, said shunts being modular in construction and adapted to being adjacently ganged whereby a plurality of shunts form a multi-station, dual-in-line packaged shunt configuration suitable for use on printed circuit boards or cards for programming or reprogramming electronic/electromechanical equipment.

These and other objects of the invention, as well as a fuller understanding of the utility and advantages thereof can be had by reference to the following disclosure and claims.

SUMMARY OF THE INVENTION

The foregoing objects are achieved according to the present invention whereby a modular, electrical DIP-shunt is provided for use in programming electric/electronic equipment.

The invention is a modular electrical shunt for use in programming electric/electronic equipment comprising a substantially rectangular housing having a plurality of walls, including a base wall having a pair of apertures in substantially mutually spaced relationship adapted to slidably receive male terminal pins, two end walls and two side walls; and a pair of elongated, electrically conducting contacts disposed within the housing, and adapted for bias induced by the insertion of male terminal pins into the housing.

In a second embodiment, the invention is a ganged electrical shunt comprising an electrically insulating, substantially rectangular housing having a plurality of electrically non-conducting walls, including a base wall having multiple pairs of apertures in substantially mutually spaced relationship adapted to slidably receive male terminal pins, two end walls and two side walls. One or more pairs of elongated, electrically conducting contacts are disposed within the housing. The contacts are adapted for bias induced by the insertion of male terminal pins into the housing.

BRIEF DESCRIPTION OF THE DRAWINGS

Further details of the present invention, including the nature, advantages, and various additional features thereof, and its preferred embodiments can be had be reference to the accompanying drawings, wherein:

FIG. 1 is an elevational view of the present invention in use, mounted on two male printed circuit board terminal pins;

FIG. 2 is a plan view of the housing without the cover;

FIG. 3 is an exploded elevational section of the invention taken along 3—3 of FIG. 2 with the cover in place;

FIG. 4 is an elevational section taken along 4—4 of FIG. 2 with the cover shown in phantom;

FIG. 8 is an elevational view of a ganged DIP-shunt shown mounted on male pins; and FIG. 9 is a sectional plan view taken along 9—9 of FIG. 8 with pins not shown.

DESCRIPTION OF THE PREFERRED EMBODIMENTS

Figure 5:
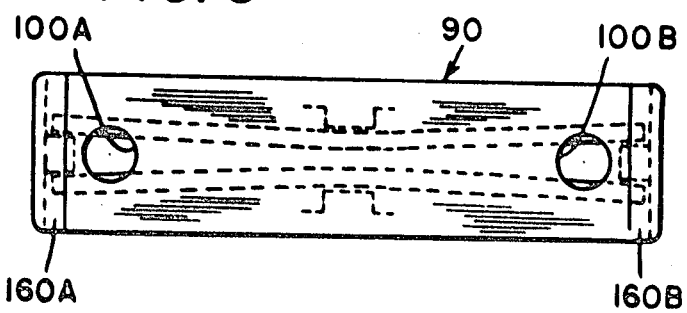
FIG. 5 is a plan view of an alternate embodiment of the present invention.

In the following description the same structural elements shown in the accompanying drawings are designated by the same reference numerals. Letter suffixes are added to denote specific ones of those elements where necessary.

Referring to FIGS. 1 through 4, the preferred embodiment of the DIP-shunt comprises four parts a rectangular housing 10, a top 90 and two electrical contacts 120A and 120B. The rectangular housing 10 has a base wall 20 containing two apertures 30A and 30B which are transversely spaced apart and adapted to receive male terminal pins 130A and 130B (as shown in FIGS. 1 and 2). The housing 10 is of essentially rectangular shape, preferably of a size designed to fit within the designated 0.050" industry standard grids. For example, a DIP-shunt designed for 0.200" terminal spacing must be no more than 0.300" long and 0.100" wide in order to achieve maximum packing density on printed circuit boards. Housing 10 has four walls including two end walls 50A and 50B each having a stop 60A and 60B on the internal sides of the end walls and two side walls 70A and 70B, each side wall having a protrusion 80A and 0B on its internal side as shown in FIG. 2.

The housing 10 has an open top which is preferably covered by a top or cover 90 although the cover may be eliminated. Cover 90 also has two apertures 100A and 100B, also adapted to slidably receive male terminal pins 130A and 130B passing through the base wall apertures 30A and 30B. Upon assembly of the DIP-shunt, the cover 90 is secured to the housing 10 by means well known in the art, such as by the use of adhesives, heat bonding or ultrasonic welding techniques. The housing 10 and cover 90 are preferably made from a suitably rigid and electrically insulating plastic material.

A pair of electrically conducting contacts 120A and 120B which are substantially linearly extending pieces of spring wire having a round cross-section are disposed within and transversely extend across housing 10, as shown in FIG. 2. The contacts 120A and 120B can be advantageously nickel-gold plated to prevent oxidation, tarnishing or film formation on the contact surfaces which might otherwise diminish conductance at the very low electrical currents normally encountered in DIP-shunt applications. Contacts 120A and 120B are given a cantilever-like spring bias by the two stops 60A and 60B and the protrusions 80A and 80B on each respective side, which create a bending moment on each contact. Insertion of a pair of terminal pins 130A and 130B into the housing apertures 30A and 30B and top cover apertures 100A and 100B causes a further spring bias by creating greater cantilever-like bending deflections between the terminal pins and side wall protrusions 80A and 80B. Retraction of terminal pins 103A and 130B from the DIP-shunt housing 10 relaxes the pin-induced bending bias on the contacts 120A and 120B, thereby reducing the bias to the original bias induced by the stops 60A and 60B and one of the two protrusions 80A and 80B.

The contacts 120A and 120B are inserted into housing 10 through the open top 90, placing each end of the contacts into the gap formed between the end wall stops 60A and 60B and respective side walls 70A and 70B. Bending bias will then be induced by contact between the end wall stops 60A and 60B and the side wall protrusions 80A and 80B. In order to facilitate insertion of the contacts, the side wall protrusions 80A and 80B can be provided with top bevelled surfaces 85A and 85B as shown in FIG. 4. Assembly of the DIP-shunt is completed by bonding cover 90 onto the open top surface of housing 10.

Figure 6:
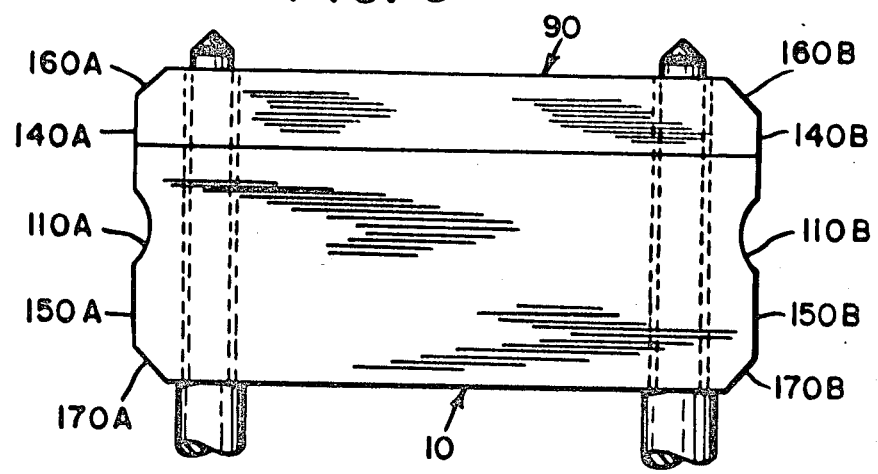
FIG. 6 is an elevational view of an alternate embodiment of the present invention.

The outer surfaces of the end walls 50A and 50B may also be provided with horizontal grooves 110A and 110B, as shown in FIG. 6, to facilitate use of an insertion tool such as that described in U.S. Pat. No. 4,356,361. To further facilitate use of an insertion tool the end faces 140A and 140B of the cover 90 and the lower portions of the end walls 150A and 150B have bevelled edges 160A and 160B and 170A and 170B, respectively, as shown in FIG. 6.

As a practical matter, the outer dimensions of the DIP-shunt are defined more or less by electronics industry standards. For instance, DIP-shunt designs for 0.200" center-line spacing between male terminal pins would have a maximum outer length of 0.300" and a maximum width of 0.100". Acceptable industry standards for DIP-shunt height could be either 0.100" or 1.250", depending upon the particular application of the shunt. Similarly, a DIP-shunt design for 0.300" male terminal center-line spacing would have a maximum outer length of 0.400" and a maximum width of 0.100".

Figure 7:
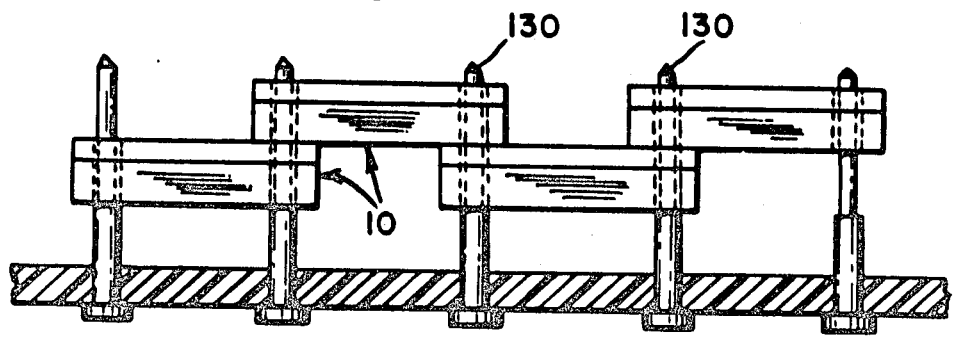
FIG. 7 is an elevational view of a multitude of shunts forming a series connection between a number of printed circuit board male terminal pins, also known as a "daisy chain"

A multitude of DIP-shunts can be combined to form a series connection between a number of terminal pins, as shown in FIG. 7. This is known in the art as "daisy chaining".

In a second embodiment, shown in FIGS. 8 and 9, a multitude of paired contacts 120A and 120B ganged in a common housing 10 to short corresponding pins in two rows of pins. The construction features are as described above for the non-ganged shunts. If shorting is not desired, contacts 120A and 120B may be eliminated from a chosen housing position as shown.

Having thus described my invention, what I claim as new and desire to secure by Letters Patent is:

1. An electrical shunt comprising:
   (a) a substantially rectangular housing having a plurality of walls, including
      (i) a base wall having a pair of transversely spaced apertures to slidably receive a pair of male terminal pins,
      (ii) two end walls, and
      (iii) two side walls; and
   (b) a pair of elongated substantially linear, electrically conducting contacts, each contact being held within the housing in a flexed position and transversely extending across the housing, past both apertures, to press against both of the pair of male terminal pins upon insertion of the male terminal pins into the housing.

2. The electrical shunt according to claim 1 wherein the base is constructed of electrically insulating material.

3. An electrical shunt comprising:
   (a) an electrically insulating, substantially rectangular housing having a plurality of electrically non-conducting walls, including
      (i) a base wall having a pair of transversely spaced apertures to slidably receive a pair of male terminal pins,
      (ii) two end walls, and
      (iii) two side walls;
   (b) an electrically insulating, substantially rectangular top cover bonded to the housing and having a pair of apertures aligned with the apertures in the base wall of the housing to slidably receive male terminal pins passing through the base wall apertures; and
   (c) a pair of elongated, substantially linear, electrically conducting contacts, each contact being held together within the housing in a flexed position and transversely extending past both base wall apertures to press against both of the pair of male terminal pins upon insertion of the male terminal pins into the housing.

4. An electrical shunt comprising:
   (a) an electrically insulating, substantially rectangular housing having an open top and a plurality of electrically non-conductive walls, including
      (i) a base wall having a pair of transversely spaced apertures to slidably receive a pair of male terminal pins,
      (ii) two end walls each having a stop on its internal side, and
      (iii) two side walls each having a protrusion on its internal side;
   (b) an electrically insulating cover bonded to the open top of the housing and having a pair of apertures aligned with the apertures in the base wall of the housing to slidably receive the pair of male terminal pins passing through the base wall apertures; and (c) a pair of elongated, substantially linear, electrically conducting contacts, each contact being held within the housing in a flexed position and transversely extending across the housing, between the two end wall stops and one side wall protrusion, to press against both of the pair of male terminal pins upon insertion of the male terminal pins into the housing.

5. An electrical shunt comprising:
(a) an electrically insulating, substantially rectangular housing having an open top and a plurality of electrically non-conducting walls, including
  (i) a base wall having a pair of transversely spaced apertures to slidably receive male terminal pins,
  (ii) two end walls each having a stop on its internal side, and
  (iii) two side walls each having a protrusion on its internal side, the side wall protrusions having bevelled faces adjoining the top of the housing;
(b) an electrically insulating cover bonded to the open top of the housing and having a pair of apertures aligned with the apertures in the base wall of the housing to slidably receive male terminal pins passing through the base wall apertures; and
(c) a pair of electrically conducting contacts disposed within the housing, each adapted for bias between the two end wall stops and one side wall protrusion and being further adapted for bias induced by the insertion of male terminal pins into the housing.

6. A ganged electrical shunt comprising:
(a) an electrically insulating, substantially rectangular housing having a plurality of electrically non-conducting walls, including
  (i) a base wall having multiple pairs of transversely spaced apertures to slidably receive multiple pairs of male terminal pins,
  (ii) two end walls, and
  (iii) two side walls; and
(b) one or more pairs of elongated, substantially linear electrically conducting contacts, each contact being held within the housing in a flexed position and transversely extending across the housing, past a pair of apertures, to press against a pair of male terminal pins upon insertion of the pair of male terminal pins into the housing.

7. A ganged electrical shunt comprising:
(a) an electrically insulating, substantially rectangular housing having a plurality of electrically non-conducting walls, including
  (i) a base wall having multiple pairs of transversely spaced apertures to slidably receive multiple pairs of male terminal pins,
  (ii) two end walls, and
  (iii) two side walls;
(b) an electrically insulating, substantially rectangular top cover bonded to the housing and having multiple pairs of transversely spaced apertures aligned with the apertures in the base wall of the housing to slidably receive male terminal pins passing through the base wall apertures; and
(c) one or more pairs of elongated, substantially linear electrically conducting contacts, each contact being held within the housing in a flexed position and transversely extending across the housing, past a pair of base wall apertures, to press against a pair of male terminal pins upon insertion of the pair of male terminal pins into the housing.

8. The electrical shunt according to any one of claims 3, 4, or 5 wherein:
each end wall has a lower portion and a horizontal groove on its external side adapted for loading the shunt onto a dispenser cartridge, said lower portions of the end walls having bevelled edges; and
the cover has end faces, said end faces having bevelled edges.

9. An electrical shunt according to claims 1 or 2 wherein:
each end wall has a lower portion and a horizontal groove on its external side for loading the shunt onto a dispenser cartridge, said lower portions of the end walls having bevelled edges; and
the shunt further comprises a cover secured to the housing and having end faces, the end faces of the cover having bevelled edges.

10. A ganged electrical shunt according to claim 6 wherein:
each end wall has a lower portion and a horizontal groove on its external side for loading the shunt onto a dispenser cartridge, said lower portions of the end walls having bevelled edges; and
the ganged electrical shunt further comprises a cover secured to the housing and having end faces, the end faces of the cover having bevelled edges.

11. A ganged electrical shunt according to claim 7 wherein:
each end wall has a lower portion and a horizontal groove on its external side for loading the shunt onto a dispenser cartridge, said lower portion of the end walls having bevelled edges; and
the cover has end faces, the end faces of the cover having bevelled edges.

* * * * *